(12) United States Patent
Guntoro et al.

(10) Patent No.: US 12,027,200 B2
(45) Date of Patent: Jul. 2, 2024

(54) MEMORY DEVICE AND METHOD FOR PERFORMING CONSECUTIVE MEMORY ACCESSES

(71) Applicant: Robert Bosch GmbH, Stuttgart (DE)

(72) Inventors: Andre Guntoro, Weil der Stadt (DE); Chirag Sudarshan, Kaiserslautern (DE); Christian Weis, Kaiserslautern (DE); Leonardo Luiz Ecco, Stuttgart (DE); Taha Ibrahim Ibrahim Soliman, Renningen (DE); Norbert Wehn, Queidersbach (DE)

(73) Assignee: ROBERT BOSCH GMBH, Stuttgart (DE)

( * ) Notice: Subject to any disclaimer, the term of this patent is extended or adjusted under 35 U.S.C. 154(b) by 127 days.

(21) Appl. No.: 17/746,065

(22) Filed: May 17, 2022

(65) Prior Publication Data
US 2022/0383937 A1 Dec. 1, 2022

(30) Foreign Application Priority Data
May 26, 2021 (DE) ...................... 10 2021 205 318.1

(51) Int. Cl.
*G11C 11/408* (2006.01)
*G11C 11/4091* (2006.01)
*G11C 11/4094* (2006.01)

(52) U.S. Cl.
CPC ...... *G11C 11/4091* (2013.01); *G11C 11/4085* (2013.01); *G11C 11/4094* (2013.01)

(58) Field of Classification Search
CPC .................................................. G11C 11/4091
See application file for complete search history.

(56) References Cited

U.S. PATENT DOCUMENTS

| | | | |
|---|---|---|---|
| 2004/0001364 A1* | 1/2004 | Bhatia .................... | G11C 7/222 365/194 |
| 2004/0001378 A1* | 1/2004 | Madan .................... | G11C 7/12 365/202 |
| 2006/0209611 A1* | 9/2006 | Tsukude ................ | G11C 11/406 365/222 |

(Continued)

FOREIGN PATENT DOCUMENTS

DE 102019116095 A1 2/2020

*Primary Examiner* — Douglas King
(74) *Attorney, Agent, or Firm* — NORTON ROSE FULBRIGHT US LLP; Gerard A. Messina

(57) ABSTRACT

A memory device comprising a plurality of memory cells situated in a first cell field, multiple first bit lines, each respectively connected to multiple memory cells of the first cell field to enable access to the memory cells via the bit line, and multiple sense amplifier pairs which respectively comprise a first and a second sense amplifier. Each first bit line is assigned to a sense amplifier pair, each first bit line being connected to a respective first semiconductor switch element, through which the bit line is electroconductively connectible to and insulatable from the first sense amplifier of the sense amplifier pair, to which the bit line is assigned. Each first bit line is connected to a respective second semiconductor switch element, through which the bit line is electroconductively connectible to and insulatable from the second sense amplifier of the sense amplifier pair, to which the bit line is assigned.

12 Claims, 4 Drawing Sheets

(56) References Cited

U.S. PATENT DOCUMENTS

| | | | |
|---|---|---|---|
| 2007/0014181 A1* | 1/2007 | Lee | G11C 7/12 |
| | | | 365/230.03 |
| 2009/0003108 A1* | 1/2009 | Somasekhar | G11C 7/08 |
| | | | 365/205 |
| 2009/0097308 A1* | 4/2009 | Rao | G11C 11/565 |
| | | | 365/174 |
| 2009/0323427 A1 | 12/2009 | Mukunoki | |
| 2012/0113731 A1 | 5/2012 | Shimano et al. | |
| 2021/0065775 A1* | 3/2021 | Hush | G11C 11/408 |
| 2022/0343968 A1* | 10/2022 | Choi | G11C 7/1051 |

* cited by examiner

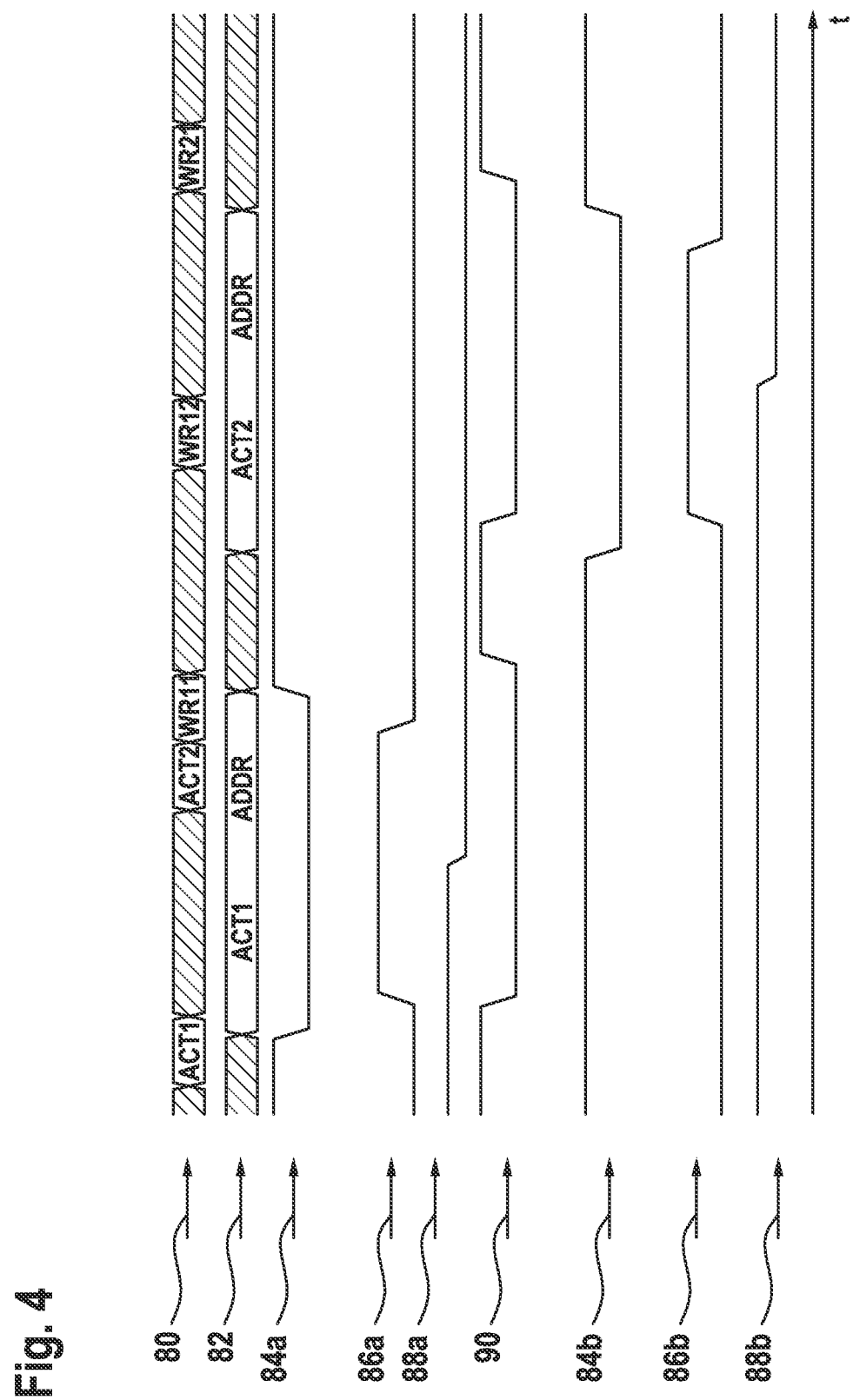

MEMORY DEVICE AND METHOD FOR PERFORMING CONSECUTIVE MEMORY ACCESSES

FIELD

The present invention relates to a memory device and to a method for performing consecutive memory accesses.

BACKGROUND INFORMATION

DRAM memory devices (DRAM: "dynamic random access memory") may be constructed hierarchically. They may be organized as a set of so-called memory banks, which comprise memory arrays. Every memory bank comprises row and column decoders, master word line drivers (MWLD) and secondary sense amplifiers (SSA). Memory arrays may comprise a plurality of subarrays, which respectively comprise a plurality of memory cells. The memory cells are connected to local word lines and local bit lines. Read and write accesses to the memory cells are performed by activating word lines and connecting the memory cells via the bit lines to primary sense amplifiers (write-read amplifier). The initially relatively weak signals of the primary sense amplifiers may be further amplified by secondary sense amplifiers.

SUMMARY

The present invention provides a memory device and a method for performing consecutive memory accesses. Advantageous developments of the present invention are disclosed herein.

The present invention makes it possible to open two pages or rows within the same memory bank simultaneously. This reduces the access time when data of a different (i.e., different from the open) page or row are to be accessed, which is known as a "row miss". For activating a new row or page in the same memory bank, a precharge command (PRE) must be issued and executed in order to equalize the voltage between the bit lines and to prepare the memory bank for a new activation of a row. During this time, data accesses are usually paused. The provision, according to the present invention, of two sense amplifier banks makes it possible to mask this time and to reduce latency times in the memory access so that, in particular in the case of applications that perform many memory accesses by "row miss", the available memory band width is better utilized and the memory access is accelerated.

The memory device comprises a plurality of memory cells situated in a first cell field and multiple first bit lines, multiple memory cells of the first cell field being respectively connected to each of the multiple first bit lines in order to allow for access to the memory cells via the connected bit line. This corresponds to a typical arrangement in a DRAM memory.

In accordance with an example embodiment of the present invention, the memory device comprises furthermore multiple sense amplifier pairs, which respectively comprise a first and a second sense amplifier, each first bit line being assigned to a sense amplifier pair; each first bit line being connected to a respective first semiconductor switch element, through which the bit line is electroconductively connectible to and insulatable from the first sense amplifier of the sense amplifier pair, to which the bit line is assigned, and each first bit line being connected to a respective second semiconductor switch element, through which the bit line is electroconductively connectible to and insulatable from the second sense amplifier of the sense amplifier pair, to which the bit line is assigned. Via the semiconductor switch elements, the first bit lines may be connected optionally to the first or to the second sense amplifier pair.

The expression "electroconductively connectible to" means that an electrically conductive connection may be established or is established in that the respective semiconductor switch element is switched into the conductive state or is in the conductive state. Accordingly, the expression "insulatable from" means that the bit line may be insulated or disconnected from the sense amplifier (i.e., no electrically conductive connection exists) in that the respective semiconductor switch element is switched into the non-conductive state or is in this state. "Electroconductively connected" or "connected" and "not electroconductively connected" or "insulated", "disconnected" are to be understood here clearly in the sense of the on/off ratio of the respective semiconductor switch element.

The expressions "connected", "connection" and the like are to be understood within the scope of this application in the sense of electrically conductive connections and are thus synonymous with "electroconductively connected", "electroconductive connection", and the like. Accordingly, "insulated" or "disconnected" is to be understood in the sense that no electrically conductive connection exists.

For simplification, "primary sense amplifiers" are called "sense amplifiers" in the context of the present application. Unless noted otherwise, "sense amplifier" is always to be understood as a primary sense amplifier or primary write-read amplifier.

In accordance with an example embodiment of the present invention, the memory device preferably comprises a controller, which is designed to control the first and second semiconductor switch element connected to the first bit lines. The controller controls gates of the semiconductor switch elements using control voltages so that these are transferred into the conductive or non-conductive state. The controller is implemented in particular as a hardware module, preferably as a state machine. The controller may be at least partially integrated in a memory device controller, which fulfills control tasks of the memory device. The controller may be situated adjacent to the cell field or at a distance from it, e.g. drivers being provided near the cell field, which produce the control voltages.

In accordance with an example embodiment of the present invention, the controller is preferably designed to control the first and second semiconductor switch elements connected to the first bit lines in such a way that in a first switch element state the first bit lines are connected to the first sense amplifiers and the first bit lines are insulated from the second sense amplifiers; in a second switch element state the first bit lines are connected to the second sense amplifiers and the first bit lines are insulated from the first sense amplifiers; and in an insulated switch element state the first bit lines are insulated from the first and the second sense amplifiers.

In the first and second switch element state, respectively, either the first or the second sense amplifiers are connected to the first bit lines, so that the memory cells are accessed by way of the first or second sense amplifiers. The disconnected switch element state is expedient in particular in order to switch between the first and the second switch element state.

In accordance with an example embodiment of the present invention, preferably, a first and a second control line are provided; the first control line being connected to the gates of the first semiconductor switch elements connected to the first bit lines and the second control line being connected to the gates of the second semiconductor switch elements connected to the first bit lines; the controller being designed to produce control voltages for the semiconductor switch elements at the first and the second control line, so that these switch into the conductive or non-conductive state. This allows for a simple control of the semiconductor switch elements connected to the first bit lines.

In accordance with an example embodiment of the present invention, the memory device comprises preferably a plurality of memory cells situated in a second cell field and multiple second bit lines, multiple memory cells of the second cell field respectively being connected to each of the second bit lines, in order to enable access to the memory cells via the bit line; each second bit line being assigned to a sense amplifier pair; each second bit line being connected to a respective first semiconductor switch element, through which the bit line is electroconductively connectible to and insulatable from the first sense amplifier of the sense amplifier pair, to which the bit line is assigned, and each second bit line being connected to a respective second semiconductor switch element, through which the bit line is electroconductively connectible to and insulatable from the second sense amplifier of the sense amplifier pair, to which the bit line is assigned.

The second bit lines may be used as reference bit lines when accessing memory cells of the first cell field (and vice versa). On account of the semiconductor switch elements connected to the second bit lines, it becomes possible to prevent the establishment of an indirect connection between the first and second sense amplifiers via the reference bit lines.

The controller is preferably designed to control the first and second semiconductor switch elements connected to the second bit lines in such a way that in the first switch element state the second bit lines are connected to the first sense amplifiers and the second bit lines are insulated from the second sense amplifiers; in the second switch element state the second bit lines are connected to the second sense amplifiers and the second bit lines are insulated from the first sense amplifiers; in the insulated switch element state the second bit lines are insulated from the first and the second sense amplifiers.

Preferably, a third and a fourth control line are provided; the third control line being connected to the gates of the first semiconductor switch elements connected to the second bit lines and the fourth control line being connected to the gates of the second semiconductor switch elements connected to the second bit lines; the controller being designed to produce control voltages for the semiconductor switch elements at the third and the fourth control line, so that these switch into the conductive or non-conductive state. This allows for a simple control of the semiconductor switch elements connected to the first bit lines.

The memory device is preferably designed to perform a memory access that comprises the following steps: a transfer of the semiconductor switch elements into the first switch element state; a transfer of the semiconductor switch elements into the insulated switch element state; and a transfer of the semiconductor switch elements into the second switch element state; the controller preferably being designed to carry out these steps. The steps are preferably carried out in the indicated order. Expediently, prior to transferring the semiconductor switch elements into the first or second switch element state, a precharging of the bit lines and/or a voltage equalization between the bit lines is provided.

The memory device preferably comprises multiple word lines, which are respectively connected to multiple memory cells of the first cell field, the access to a memory cell being made possible via the first bit lines connected to the memory cell when a word line voltage is applied to the word line connected to the memory cell; the memory device being designed to carry out furthermore the following steps during a memory access: applying the word line voltage to a first word line after transferring the semiconductor switch elements into the first switch element state; terminating the application of the word line voltage to the first word line; and applying the word line voltage to a second word line after transferring the semiconductor switch elements into the second switch element state. This manner of proceeding makes it possible to cover possible latency times in consecutive accesses. Further preferably, the memory access comprises a termination of the application of the word line voltage to the second word line.

The memory device preferably comprises multiple secondary sense amplifiers; the first sense amplifiers being electroconductively connectible to and insulatable from the secondary sense amplifiers and the second sense amplifiers being electroconductively connectible to and insulatable from the secondary sense amplifiers.

In contrast to the usual design, it is thus not necessary to double the number of secondary sense amplifiers. An arrangement of switch element (semiconductor switch elements or transistors) may be provided, which switches connections between first or second sense amplifiers and the secondary sense amplifiers between conductive and non-conductive states. For example, semiconductor switch elements may be situated respectively between the first sense amplifiers and main data lines or between the second sense amplifiers and main data lines, the main data lines being connected to the secondary sense amplifiers.

The controller is preferably designed to control connection switch elements, so that in a first connection state the first sense amplifiers are connected to the secondary sense amplifiers and the second sense amplifiers are insulated from the secondary sense amplifiers; in a second connection state the second sense amplifiers are connected to the secondary sense amplifiers and the first sense amplifiers are insulated from the secondary sense amplifiers; and in a disconnected connection state the first sense amplifiers and the second sense amplifiers are insulated from the secondary sense amplifiers.

Each memory cell preferably comprises an access transistor and an energy or charge-coupled memory, such as e.g. a capacitor. The access transistor connects the charge-coupled memory to the bit line in a switchable manner, the access transistor being controlled by a voltage at the word line.

The first and second semiconductor switch elements connected to the first bit lines are preferably transistors, particularly field-effect transistors, preferably metal-oxide-semiconductor field-effect transistors; and, if applicable, the first and second semiconductor switch elements connected to the second bit lines are transistors, particularly field-effect transistors, preferably metal-oxide-semiconductor field-effect transistors.

In accordance with an example embodiment, a method according to the present invention for performing consecutive accesses to memory cells of a memory device according to the present invention, the memory device comprising multiple word lines, which are respectively connected to multiple memory cells of the first cell field, the access to a memory cell via the first bit lines connected to the memory cell being made possible if a word line voltage is applied to the word line connected to the memory cell, comprises a transfer of the semiconductor switch elements into the first switch element state, an application of the word line voltage to a first word line, a termination of the application of the word line voltage to the first word line, a transfer of the semiconductor switch elements into the insulated switch element state, a transfer of the semiconductor switch element into the second switch element state and an application of the word line voltage to the second word line. Preferably, prior to transferring the semiconductor switch elements into the first or second switch element state, a precharging of the first and second bit lines is respectively provided. The steps are in particular carried out in the indicated order.

Additional advantages and developments of the present invention derive from the description and the figures.

The present invention is represented schematically in the figures on the basis of exemplary embodiments and described below with reference to the figures.

BRIEF DESCRIPTION OF THE DRAWINGS

FIG. 4 shows generally the control and state flow of a memory device according to the present invention.

DETAILED DESCRIPTION OF EXAMPLE EMBODIMENTS

Figure 1:
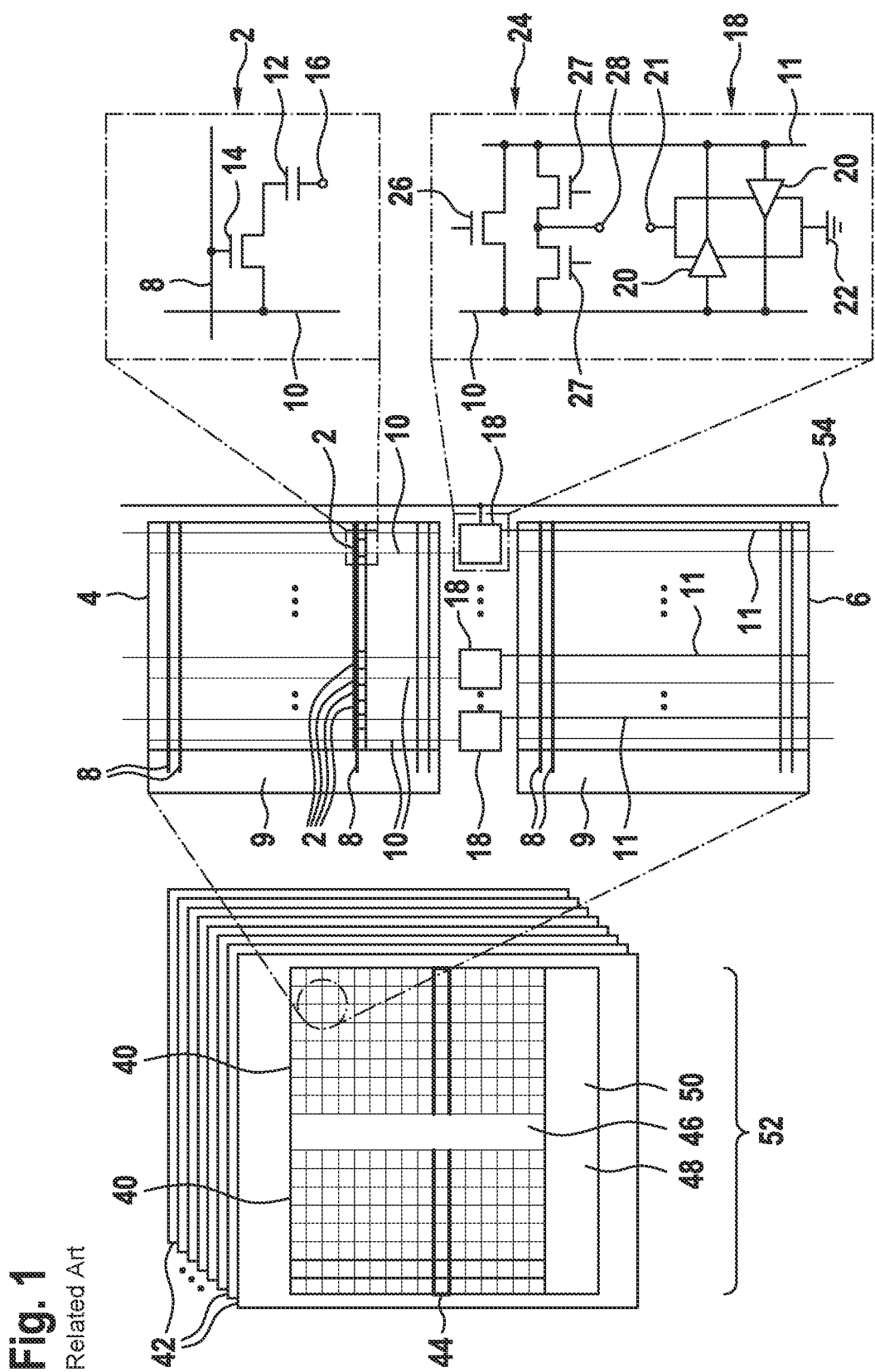
FIG. 1 shows a conventional memory device, in which memory cells are situated in cell fields, it being possible to access the memory cells via bit lines using sense amplifiers.

FIG. 1 shows a convention memory device, in which memory cells are arranged in arrays, it being possible to access the memory cells via bit lines using primary sense amplifiers. The figure shows the typical hierarchical structure of a portion of a DRAM memory.

The memory cells 2 are arranged in cell fields 4, 6 respectively in rows and columns (only a few representative memory cells are drawn as small rectangles in the cell fields). In general, a DRAM memory comprises a plurality of such cell fields 4, 6, which are hence also called sub-arrays. Several such sub-arrays are combined to memory arrays 40, which are comprised in so-called memory banks 42. Each memory bank includes row decoders 46 and column decoders 48, master word line drivers and secondary sense amplifiers 50 (not shown in detail). The sub-arrays (cell fields) are arranged in rows and columns, a row of sub-arrays (cell fields 4, 6) being referred to as a memory block 44 or block.

In order to access memory cells 2, an activation command (ACT) is issued to a specific row of memory cells, which activates the associated master word line driver of a memory bank and thus activates local word lines of the sub-arrays (cell fields) via local word line drivers 9. This establishes a charge division relationship between the memory cells and the local bit lines connected to them. Voltage differences arising as a result on the local bit lines are detected by primary sense amplifiers that are integrated with the sub-arrays. In the process, data of a row of memory cells of all sub-arrays in a block are detected simultaneously by the primary sense amplifiers (called a page opening), which may be regarded as a large row buffer or detection of a large page. The page size 52 therefore extends over the entire memory bank (the page size may be e.g. 1 KB). Following the row activation, read commands (RD) or write commands (WR) may be issued to specific columns of this logical row buffer in order to access data via the main data lines 54 (merely one illustrated by way of example) and the secondary sense amplifiers.

The memory cells 2 are electroconductively connected to word lines 8 and bit lines 10, 11 (only some respectively shown in representative fashion), the word lines 8 extending along the rows and the bit lines 10, 11 extending along the columns. The memory cells 2 may be accessed via bit lines 10, i.e., the memory content may be written into memory cells 2 and read out of them via bit lines 10, 11. The bit lines are run out of the cell fields 4, 6 (i.e. the sub-arrays) alternately downward (bit lines 10) and upward (bit lines 11).

One detail on the top right in the figure illustrates in exemplary fashion the structure of a DRAM memory cell 2. A capacitor 12 serves as the memory element, in which a charge corresponding to the memory value may be stored. A transistor 14, called an access transistor, is provided, which makes it possible to switch a connection between the bit line 10 and the capacitor 12 back and forth between a conductive and a non-conductive state. The gate of access transistor 14 is connected to word line 108, the drain terminal is connected to bit line 10 and the source terminal is connected to a terminal or to a side (the upper side in the figure) of capacitor 12, i.e. to a capacitor plate. Due to this simple structure, the memory cells require only very little chip area. The structurally determined size of a memory cell is often specified as a multiple of the square area $F^2$ of the smallest producible structural length F. Such a DRAM memory cell typically requires 6 $F^2$ or 8 $F^2$. The structural length F may be smaller than 10 nm.

If a sufficient word line voltage is applied to word line 8 by way of local word line drivers 9, capacitor 12 is electroconductively connected to bit line 10. The second, lower side (lower terminal) of capacitor 12 is connected to a node 16, which is maintained at a specified voltage $V_{P1}$. For this purpose, node 16 is connected to a voltage source that is common for all memory cells. This voltage is typically equal to half of a supply voltage $V_{DD}$ or bit line voltage $V_{BL}$ ($V_{P1}=V_{BL}/2$). The voltage at the upper side of the capacitor corresponds to the memory state, a voltage of approximately 0 V or of approximately $V_{BL}$ being applied here, corresponding to the two possible values of a bit. Through leakage currents, charge drains off from the capacitor so that the capacitor voltage falls and a so-called refresh must be performed at certain time intervals, in which the memory cells of a row are connected to and then disconnected from sense amplifiers. Memory cells 2, in which the access transistor 14 is in a conductive state, are designated as activated or are in an activated state. Rows, whose memory cells are activated, are also designated as activated or are in an activated state.

Since the capacitance of capacitors 12 of memory cells 2 is very small, in particular small compared to a capacitance of bit lines 10, the connection of the capacitors to the bit lines results only in small voltage differences of the bit lines (approximately in the range of 100 mV). These small voltage differences are amplified using sense amplifiers 18.

FIG. 1 shows primary sense amplifiers 18, with the aid of which the memory content (stored charge) of memory cells may be read out and which at the same time serve to write the memory content into the memory cells. For simplification, "primary sense amplifiers" are called "sense amplifiers". Unless noted otherwise, "sense amplifier" is always to be understood as a primary sense amplifier. Each sense amplifier 18 is connected to two bit lines 10, 11, namely, respectively a bit line from each of the two cell fields 4, 6. If memory cells in the upper cell field 4 are read out via bit lines 10 (by activating a row in the upper cell field), the bit lines 11 of the lower cell field 6, which are connected to the sense amplifiers 18, act as reference bit lines, no row being activated in the lower cell field. Prior to activating the row, bit lines 10, 11 are precharged to a specified voltage (more precisely to half of the bit line voltage $V_{BL}/2$), and the voltage between the two bit lines, which are connected to a sense amplifier, is equalized. The application of the word line voltage to a word line (activation of the row) results in a small voltage difference between the bit lines, which are connected to the memory cells that are to be accessed, and the reference bit lines. The application of the word line voltage to a word line is also referred to as activating the word line.

A detail shows a typical structure of a sense amplifier 18. It comprises essentially two degenerated inverters 20, which are connected to two bit lines 10, 11. The supply terminals of the inverters are supplied on the one hand with the bit line voltage $V_{BL}$ (node/terminal 21) and on the other hand with a reference voltage (0 V, node/terminal 22). A small voltage difference between the bit lines 10, 11 is amplified by sense amplifier 18, so that the bit line voltage $V_{BL}$ is applied on one bit line, and the reference voltage (0 V) is applied on the other bit line. These voltages may then be read out via the secondary sense amplifiers and amplified further. The inverters may be constructed as CMOS inverters (CMOS: complementary metal-oxide semiconductor) from two transistors (a PMOS, p-channel metal-oxide semiconductor field-effect transistor, and an NMOS, re-channel metal-oxide semiconductor field-effect transistor). Accordingly, a sense amplifier is in the simplest case constructed from four transistors.

In a write process, in principle a voltage difference is produced at the sense amplifiers 18 (in accordance with the bits to be stored) and thus corresponding voltages or charges are produced at the capacitors 12 of the memory cells 2 of an activated row. By transferring the access transistors 14 then into the non-conductive state (in the process of which e.g. the voltage at the respective word line is brought to 0), the respective charges in capacitors 12 are maintained. Every read process is at the same time also connected to a write process, in which the stored values are renewed (refresh).

Due to the structure, every row, i.e. all memory cells of a row, is always accessed simultaneously. A row is also called a "page". Since both read as well as write processes occur by way of the sense amplifiers, the latter are also called "write-read amplifiers".

The detail furthermore shows in simplified fashion an equalization circuit 24, which is used to equalize the voltage between the two bit lines 10, 11 connected to the sense amplifier 18. Equalization circuit 24 may be regarded as part of sense amplifier 18. As shown here, it may be implemented using one or multiple switch elements 26, 27 (in particular semiconductor switch elements or transistors). A terminal 28 may be provided, via which (when connected to an appropriate supply line) the bit lines 10, 11 may be precharged (to half of the bit line voltage $V_{BL}/2$).

The arrangement of memory cells shown in FIG. 1 in two spatially separated cell fields and their illustrated connection via bit lines with sense amplifiers is usually referred to as an "open bit line architecture". Also conventional is an arrangement in which the memory cells together with the bit lines, which are connected to a sense amplifier, are arranged in a cell field, the bit lines running in a kind of zig-zag path through the cell field; the two cell fields being laid into each other or folded, as it were. This arrangement is known by the term "folded bit line architecture". The present invention may in principle be implemented in both arrangements or also in other arrangements, the description below being provided with reference to figures that show an "open bit line architecture".

Figure 2:
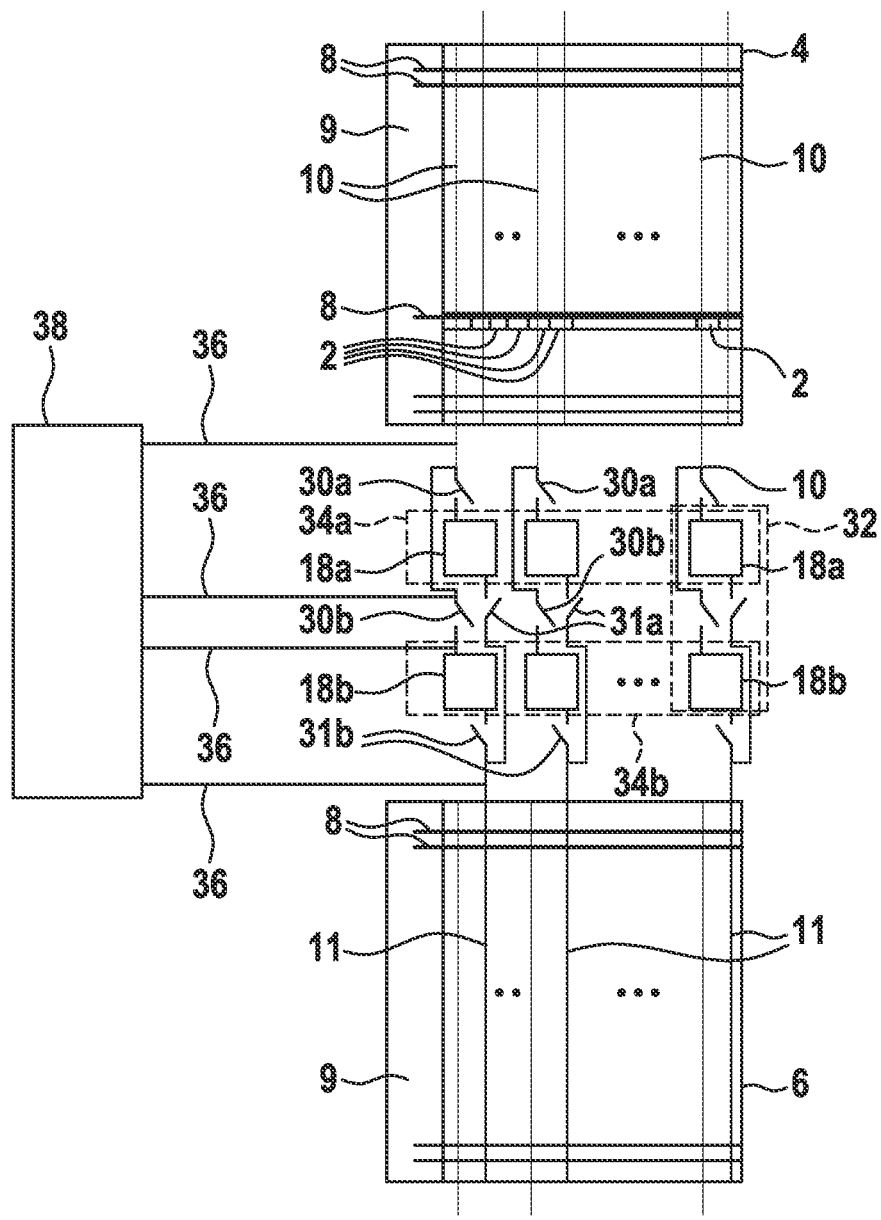
FIG. 2 shows a portion of a memory device according to a preferred specific embodiment of the present invention.

FIG. 2 shows a portion of a memory device according to a preferred specific embodiment of the present invention. In contrast to FIG. 1, here each of the bit lines 10, 11 is connectible to two different sense amplifiers. Again, two cell fields 4, 6 or memory fields are shown, in which memory cells 2 are arranged in rows and columns, the memory cells being again connected to word lines 8 and bit lines 10, 11. The higher-level structure in terms of memory banks and the structure of the cell fields 4, 6, i.e., in particular of memory cells 2 and their connection to the bit lines 10, 11, corresponds to the structure illustrated in FIG. 1 and is therefore not explained again.

The sense amplifiers are arranged in pairs, i.e., sense amplifier pairs 32, which are respectively formed of a first sense amplifier 18a and a second sense amplifier 18b. Each bit line 10, 11 is assigned to a sense amplifier pair and thus to the first and to the second sense amplifier of the sense amplifier pair. Bit lines 10, 11 are connected to the first sense amplifier 18a and to the second sense amplifier 18b via semiconductor switch elements 30a, 30b, 31a, 31b. Each bit line 10, 11 is connectible to and disconnectible from the first sense amplifier 18a by a first semiconductor switch element 30a, 31a, in that the semiconductor switch element 30a, 31a is switched to a conductive state or a non-conductive state, respectively. Likewise, each bit line 10, 11 is connectible to and disconnectible from the second sense amplifier 18b by a second semiconductor switch element 30b, 31b, in that the semiconductor switch element 30b, 31b is switched to a conductive state or a non-conductive state, respectively. Only some elements are in each instance labeled by reference character in order to keep the figure clear.

Each (first/second) sense amplifier 18a, 18b functions as described in connection with FIG. 1 and may have the structure as explained in connection with FIG. 1. The first sense amplifiers 18a together may be regarded as first sense amplifier bank 34a; the second sense amplifiers 18b together may be regarded as second sense amplifier bank 34b.

The semiconductor switch elements 30a, 30b, 31a, 31b are implemented as transistors, in particular field-effect transistors, preferably metal-oxide semiconductor field-effect transistors. The semiconductor switch elements 30a, 30b are controlled via control lines 36 (illustrated only partially or symbolically), which are connected to gates of the semiconductor switch elements. For this purpose, a controller 38 is preferably provided, which is connected to the control lines 36 and is set up to produce suitable control voltages on the control lines.

Preferably, all semiconductor switch elements 30a, 31a, which connect the bit lines of one of the cell fields to the first sense amplifiers 18b, are jointly controllable, that is, are connected to the same control line, and all semiconductor switch elements 30b, 31b, which connect the bit lines of one of the cell fields with the second sense amplifiers 18b, are jointly controllable, that is, are connected to the same control line.

Controller 38 is in particular set up (by producing appropriate control voltages on the control lines 36) to switch all first semiconductor switch elements 30a, 31a into the conductive or non-conductive state and, independently thereof, to switch all second semiconductor switch elements 30b, 31b into the conductive or non-conductive state. If all first semiconductor switch elements 30a, 31a are switched into the conductive state, this is designated as the activation of the first sense amplifier bank 34a or the first sense amplifier bank 34a is designated as activated; otherwise, i.e. first semiconductor switch elements 30a, 31a are in the non-conductive state, first sense amplifier bank 34a is deactivated. If all second semiconductor switch elements 30b, 31b are switched into the conductive state, this is designated as the activation of the second sense amplifier bank 34b or the second sense amplifier bank 34b is designated as activated; otherwise, i.e. second semiconductor switch elements 30b, 31b are in the non-conductive state, second sense amplifier bank 34b is deactivated. The controller is in particular set up to activate precisely one of the sense amplifier banks 34a, 34b, that is, to connect the sense amplifiers of a sense amplifier bank to the bit lines.

If the first sense amplifier bank is activated and the second sense amplifier bank is deactivated, this is also designated as the first switch element state (of semiconductor switch elements 30a, 30b, 31a, 31b). If the second sense amplifier bank is activated and the first sense amplifier bank is deactivated, this is also designated as the second switch element state. If the first and the second sense amplifier banks are deactivated, then this is also designated as the insulated or disconnected switch element state.

Main data lines are not illustrated here. The secondary sense amplifiers belonging to the higher-level structure preferably remain unchanged, that is, they are not doubled in number. The primary sense amplifiers, i.e. the first sense amplifiers 18a and the second sense amplifiers 18b, may be connected to the secondary sense amplifiers of to the main data lines connected to these via suitable switch element (transistors), so that the first sense amplifiers and the second sense amplifiers may be alternatively connected to the respective secondary sense amplifiers.

Figure 3:
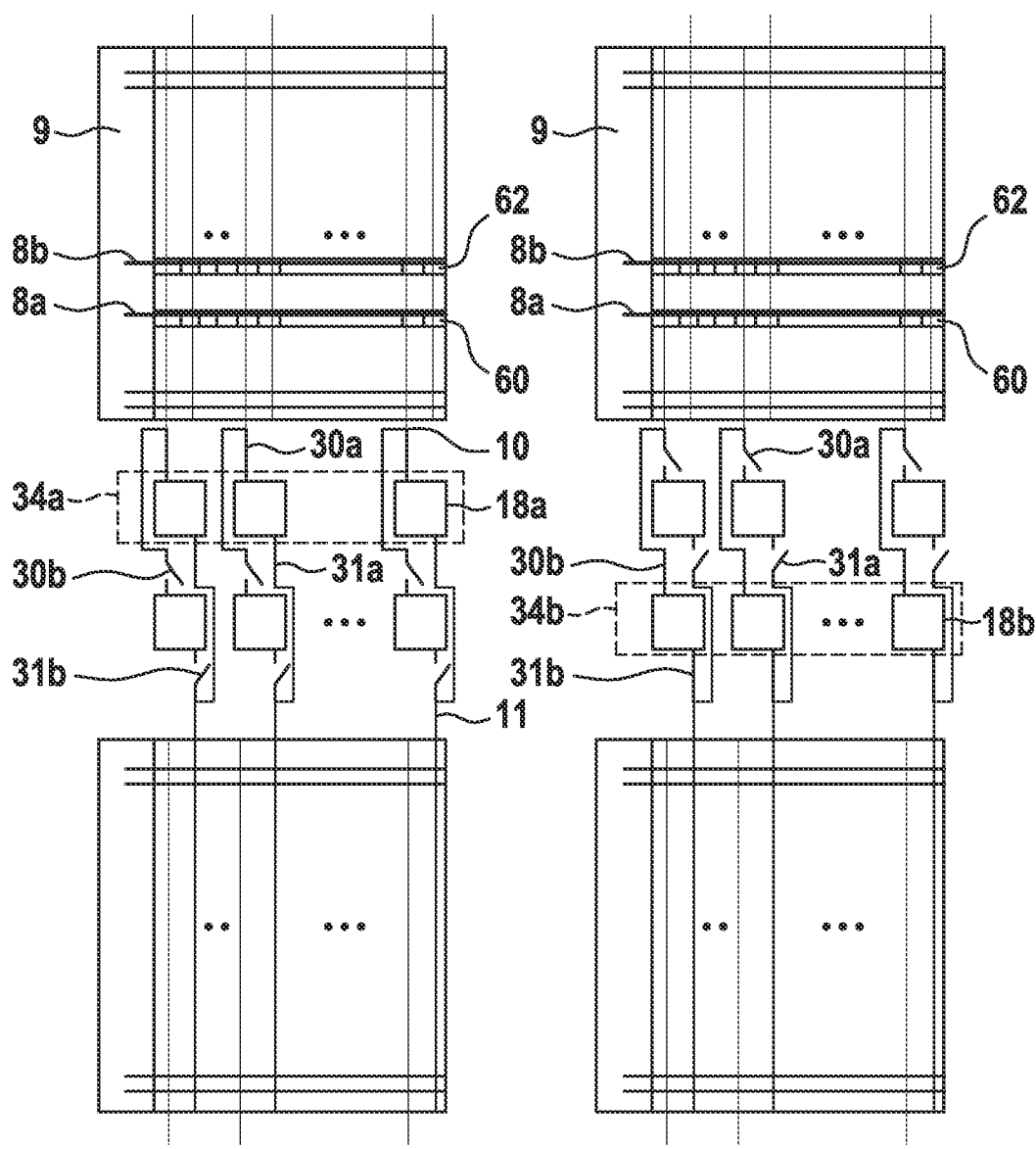
FIG. 3 shows accesses to memory cells of two rows or pages of a memory array comprising multiple cell fields.

FIG. 3 shows accesses to memory cells of two rows or 60, 62 of cell field 4 or pages of the memory array comprising multiple cell fields. For this purpose, initially (left side of the figure) the first sense amplifier bank 34a is used in order to access the memory cells of the first row 60, and subsequently the second sense amplifier bank 34b is used in order to access the memory cells of the second row 62. Reference characters are largely omitted in this case, since the respective elements were already described in connection with FIG. 2; the controller, which controls in particular the semiconductor switch elements 30a, 30b, 31a, 31b, is also not illustrated.

It is assumed that the bit lines are precharged. The first sense amplifier bank 34a is then activated (on the left side in the figure), in that the first semiconductor switch elements 30a, 31a are switched into the conductive state, and the second sense amplifier bank 34b is deactivated, in that the second semiconductor switch elements 30b, 31b are switched into the non-conductive state. As illustrated, in this state the first sense amplifiers 18a are connected to bit lines 10, 11 and the second sense amplifiers 18b are disconnected from bit lines 10, 11. A voltage (word line voltage) is applied to the first word line 8a connected to the memory cells of the first row 60 in order to activate the memory cells, i.e., to connect the capacitors of the memory cells to the bit lines. No voltage is applied to the other word lines, that is, the memory cells connected to these other word lines are not connected to the bit lines. The memory states (voltage or charge differences) of the memory cells of the first row 60 are transferred to the first sense amplifiers 18a and are amplified by the latter. This corresponds to the procedure as explained in connection with FIG. 1.

Subsequently, the voltage at the first word line 8a is reduced or brought to 0, i.e., the application of the word line voltage is terminated. Furthermore, the first sense amplifier bank 34a is deactivated, i.e. is disconnected or insulated from the bit lines, in that the first semiconductor switch elements 30a, 31a are switched into the non-conductive state. Following the deactivation of the first sense amplifier bank, the bit lines are again precharged (to $V_{BL}/2$). Subsequently, the second sense amplifier bank 34b is activated, while the first sense amplifier bank 34a remains deactivated. That is, the second semiconductor switch elements 30b, 31b are switched into the conductive state, while the first semiconductor switch elements 30a, 31a remain in the non-conductive state. In order to be able to access the memory cells of the second row 62, a voltage (word line voltage) is applied to the second word line 8b, which is connected to the memory cells of the second row 62 (all other word lines remain at a low voltage level, so that the access transistors of the memory cells, which are connected to these other word lines, do not switch into the conductive state). A memory content of the memory cells is then transferred into the second sense amplifiers 18b of the second sense amplifier bank 34b and is amplified by the latter.

The access (read access and/or write access to the memory cells of the two rows), i.e. the activation of the word lines and sense amplifier banks, occurs consecutively. The memory content of the memory cells that is read out or, in the case of a write access, that is to be written may be held for both rows simultaneously in the first or second sense amplifiers, respectively. In this sense, both rows or pages are simultaneously open.

This makes it possible to reduce or mask latency times in the case of multiple memory accesses. For example, in the above example of FIG. 3, in the event of a read access to the first row 60, the content of the latter may be transferred from the first sense amplifiers 18a to the secondary sense amplifiers, while at the same time the second row 62 is activated. The activation of the second row or page is thus masked. Likewise, while the first row is activated, data to be written into the second row during a write access (e.g. by the secondary sense amplifiers) may be transferred into the second sense amplifiers 18b.

FIG. 4 shows generally the control and state flow of a memory device according to the present invention. Instructions/commands or corresponding control voltages and states assumed by components of the memory device are plotted against time t.

Row 80 shows commands on a instruction bus of the memory device. ACT1 and ACT2 are activation commands for a first word line or row (e.g. row 60 in FIG. 3) and a second word line or row (e.g. row 62 in FIG. 3). Furthermore, read or write commands WR11, WR12, WR21 are transmitted on the instruction bus. Row 82 shows a row address bus, on which the row addresses ACT1 ADDR and ACT2 ADDR, which refer to the respective activation commands, are transmitted.

The rows 84a and 84b indicate the states or control voltages of the first semiconductor switch elements and second semiconductor switch elements and accordingly whether the respective sense amplifier bank is activated (connected to the bit lines) or deactivated (insulated from the bit lines). Row 84a pertains to the first sense amplifier bank and row 84b pertains to the second sense amplifier bank, the respective sense amplifier bank being deactivated when the signal has a high voltage level and being deactivated when the signal has a low voltage level.

Rows 86a and 86b show the voltages at the word lines, which correspond to the row addresses. Row 86a pertains to the first word line (e.g. word line 8a in FIG. 3) and row 86a pertains to the second word line (e.g. word line 8b in FIG. 3). A high voltage level corresponds to the word line voltage.

Rows 86a and 86b indicate whether the first sense amplifiers or second sense amplifiers are active (are supplied with supply voltage).

Row 90 indicates whether transistors (e.g. transistor 16 in FIG. 1) of the equalization circuit between the bit lines and the bit lines used as reference are conductive (high voltage level) or non-conductive (low voltage level). Thus, at a high level voltage, a charge equalization occurs.

What is claimed is:

1. A memory device, comprising:
    a plurality of memory cells situated in a first cell field;
    multiple first bit lines, multiple memory cells of the first cell field being respectively connected to each of the multiple first bit lines so as to enable access to the memory cells via the bit line;
    multiple sense amplifier pairs, each sense amplifier pair respectively including a first and a second sense amplifier, each first bit line being assigned to a sense amplifier pair of the amplifier pairs;
    each first bit line is connected to a respective first semiconductor switch element, through which the first bit line is electroconductively connectible to and insulatable from the first sense amplifier of the sense amplifier pair, to which the first bit line is assigned, and each first bit line is connected to a respective second semiconductor switch element, through which the first bit line is electroconductively connectible to and insulatable from the second sense amplifier of the sense amplifier pair to which the first bit line is assigned;
    multiple secondary sense amplifiers, the first sense amplifiers and the second sense amplifiers being electroconductively connectible to and insulatable from the secondary sense amplifiers; and
    a controller configured to control the first and second semiconductor switch elements connected to the first bit lines, the controller being configured to control the first and second semiconductor switch elements so that:
    in a first connection state, the first sense amplifiers are connected to the secondary sense amplifiers and the second sense amplifiers are insulated from the secondary sense amplifiers;
    in a second connection state, the second sense amplifiers are connected to the secondary sense amplifiers and the first sense amplifiers are insulated from the secondary sense amplifiers; and
    in a disconnected connection state, the first sense amplifiers and the second sense amplifiers are insulated from the secondary sense amplifiers.

2. The memory device as recited in claim 1, further comprising:
    a controller configured to control the first and second semiconductor switch elements connected to the first bit lines.

3. The memory device as recited in claim 2, wherein the controller is configured to control the first and second semiconductor switch elements connected to the first bit lines in such a way that:
    in a first switch element state, the first bit lines are connected to the first sense amplifiers and the first bit lines are insulated from the second sense amplifiers;
    in a second switch element state, the first bit lines are connected to the second sense amplifiers and the first bit lines are insulated from the first sense amplifiers; and
    in an insulated switch element state, the first bit lines are insulated from the first and the second sense amplifiers.

4. The memory device as recited in claim 2, further comprising a first and a second control line, the first control line being connected to gates of the first semiconductor switch elements connected to the first bit lines and the second control line being connected to gates of the second semiconductor switch elements connected to the first bit lines, wherein the controller is configured to produce control voltages for the first and second semiconductor switch elements at the first and at the second control line, so that the first and second semiconductor switch elements switch into the conductive or non-conductive state.

5. The memory device as recited in claim 1, further comprising:
    a plurality of memory cells situated in a second cell field; and
    multiple second bit lines, multiple memory cells of the second cell field being respectively connected to each of the second bit lines so as to enable access to the memory cells via the bit line;
    each second bit line is assigned to one of the sense amplifier pairs, each second bit line is connected to a respective first semiconductor switch element, through which the second bit line is electroconductively connectible to and insulatable from the first sense amplifier of the sense amplifier pair to which the second bit line is assigned, and each second bit line is connected to a respective second semiconductor switch element, through which the second bit line is electroconductively connectible to and insulatable from the second sense amplifier of the sense amplifier pair to which the second bit line is assigned.

6. The memory device as recited in claim 5, further comprising:
    a controller configured to control the first and second semiconductor switch elements connected to the first bit lines, the controller is configured to control the first and second semiconductor switch elements connected to the first bit lines in such a way that:
    in a first switch element state, the first bit lines are connected to the first sense amplifiers and the first bit lines are insulated from the second sense amplifiers,
    in a second switch element state, the first bit lines are connected to the second sense amplifiers and the first bit lines are insulated from the first sense amplifiers, and
    in an insulated switch element state, the first bit lines are insulated from the first and the second sense amplifiers;
    wherein the controller is configured to control the first and second semiconductor switch elements connected to the second bit lines in such a way that:
    in the first switch element state, the second bit lines are connected to the first sense amplifiers and the second bit lines are insulated from the second sense amplifiers,
    in the second switch element state the second bit lines are connected to the second sense amplifiers and the second bit lines are insulated from the first sense amplifiers, in the insulated switch element state, the second bit lines are insulated from the first and the second sense amplifiers.

7. The memory device as recited in claim 6, further comprising a third and a fourth control line, the third control line being connected to gates of the first semiconductor switch elements connected to the second bit lines, and the fourth control line being connected to gates of the second semiconductor switch elements connected to the second bit lines, and wherein the controller is configured to produce control voltages, for the first and second semiconductor switch elements connected to the second bit lines, at the third and at the fourth control line, so that the first and second semiconductor switch elements connected to the second bit lines switch into the conductive or non-conductive state.

8. The memory device as recited in claim 6, wherein the controller is configured to perform a memory access by:
transferring the first and second semiconductor switch elements into the first switch element state;
transferring the first and second semiconductor switch elements into the insulated switch element state;
transferring the first and second semiconductor switch elements into the second switch element state; and
multiple word lines which are respectively connected to multiple memory cells of the first cell field, the access to a memory cell being made possible via the first bit lines connected to the memory cell when a word line voltage is applied to the word line connected to the memory cell;
wherein the memory device is configured to carry out the following steps during a memory access:
applying the word line voltage to a first word line after transferring the first and second semiconductor switch elements into the first switch element state;
terminating the application of the word line voltage to the first word line;
applying the word line voltage to a second word line after transferring the first and second semiconductor switch elements into the second switch element state.

9. The memory device as recited in claim 5, wherein the first and second semiconductor switch elements connected to the second bit lines are transistors metal-oxide-semiconductor field-effect transistors.

10. The memory device as recited in claim 1, wherein each memory cell includes an access transistor and a charge-coupled memory.

11. The memory device as recited in claim 1, wherein the first and second semiconductor switch elements connected to the first bit lines are metal-oxide-semiconductor field-effect transistors.

12. A method for performing consecutive memory accesses to memory cells of a memory device, the memory device including:
a plurality of memory cells situated in a first cell field, multiple first bit lines, multiple memory cells of the first cell field being respectively connected to each of the multiple first bit lines so as to enable access to the memory cells via the bit line, and
multiple sense amplifier pairs, each sense amplifier pair respectively including a first and a second sense amplifier, each first bit line being assigned to a sense amplifier pair of the amplifier pairs,
each first bit line is connected to a respective first semiconductor switch element, through which the first bit line is electroconductively connectible to and insulatable from the first sense amplifier of the sense amplifier pair, to which the first bit line is assigned, and each first bit line is connected to a respective second semiconductor switch element, through which the first bit line is electroconductively connectible to and insulatable from the second sense amplifier of the sense amplifier pair to which the first bit line is assigned,
a plurality of memory cells situated in a second cell field,
multiple second bit lines, multiple memory cells of the second cell field being respectively connected to each of the second bit lines so as to enable access to the memory cells via the bit line,
each second bit line is assigned to one of the sense amplifier pairs, each second bit line is connected to a respective first semiconductor switch element, through which the second bit line is electroconductively connectible to and insulatable from the first sense amplifier of the sense amplifier pair to which the second bit line is assigned, and each second bit line is connected to a respective second semiconductor switch element, through which the second bit line is electroconductively connectible to and insulatable from the second sense amplifier of the sense amplifier pair to which the second bit line is assigned, and
a controller configured to control the first and second semiconductor switch elements connected to the first bit lines, the controller is configured to control the first and second semiconductor switch elements connected to the first bit lines in such a way that:
in a first switch element state, the first bit lines are connected to the first sense amplifiers and the first bit lines are insulated from the second sense amplifiers,
in a second switch element state, the first bit lines are connected to the second sense amplifiers and the first bit lines are insulated from the first sense amplifiers, and
in an insulated switch element state, the first bit lines are insulated from the first and the second sense amplifiers,
wherein the controller is configured to control the first and second semiconductor switch elements connected to the second bit lines in such a way that:
in the first switch element state, the second bit lines are connected to the first sense amplifiers and the second bit lines are insulated from the second sense amplifiers,
in the second switch element state the second bit lines are connected to the second sense amplifiers and the second bit lines are insulated from the first sense amplifiers,
in the insulated switch element state, the second bit lines are insulated from the first and the second sense amplifiers;
wherein the memory device further comprises multiple word lines, which are respectively connected to multiple memory cells of the first cell field, the access to a memory cell being made possible via the first bit lines connected to the memory cell when a word line voltage is applied to the word line connected to the memory cell, and the method comprises:
transferring the first and second semiconductor switch elements into the first switch element state;
applying the word line voltage to a first word line;
terminating the application of the word line voltage to the first word line;
transferring the first and second semiconductor switch elements into the insulated switch element state;

transferring the first and second semiconductor switch elements into the second switch element state;
applying the word line voltage to a second word line;
prior to transferring the first and second semiconductor switch elements into the first or second switch element state, precharging the first and second bit lines respectively.

* * * * *